(12) United States Patent
Cheshire et al.

(10) Patent No.: US 8,937,017 B2
(45) Date of Patent: *Jan. 20, 2015

(54) METHOD AND APPARATUS FOR ETCHING

(75) Inventors: Alan Cheshire, Glasgow (GB); Stanley Detmar, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 944 days.

This patent is subject to a terminal disclaimer.

(21) Appl. No.: 12/696,773

(22) Filed: Jan. 29, 2010

(65) Prior Publication Data

US 2010/0197138 A1    Aug. 5, 2010

Related U.S. Application Data

(60) Provisional application No. 61/148,928, filed on Jan. 31, 2009.

(51) Int. Cl.
| | | |
|---|---|---|
| H01L 21/302 | (2006.01) | |
| H01L 21/461 | (2006.01) | |
| H01L 21/311 | (2006.01) | |
| H01J 37/32 | (2006.01) | |

(52) U.S. Cl.
CPC ....... *H01J 37/32449* (2013.01); *H01J 37/3244* (2013.01); *H01J 2237/334* (2013.01)
USPC ............. 438/696; 216/67; 438/694; 438/695; 438/700

(58) Field of Classification Search
USPC ............ 216/67; 438/689, 694–696, 700, 702, 438/703, 710
See application file for complete search history.

(56) References Cited

U.S. PATENT DOCUMENTS

| | | | | |
|---|---|---|---|---|
| 5,230,741 A | * | 7/1993 | van de Ven et al. | 118/728 |
| 5,270,266 A | * | 12/1993 | Hirano et al. | 438/715 |
| 5,374,594 A | | 12/1994 | van de Ven et al. | |
| 5,856,906 A | * | 1/1999 | Kholodenko et al. | 361/234 |
| 6,051,503 A | | 4/2000 | Bhardwaj et al. | |
| 6,261,962 B1 | | 7/2001 | Bhardwaj et al. | |
| 6,303,513 B1 | * | 10/2001 | Khan et al. | 438/714 |
| 6,531,068 B2 | | 3/2003 | Laermer et al. | |
| 6,624,082 B2 | | 9/2003 | Luo et al. | |
| 8,298,959 B2 | | 10/2012 | Cheshire | |

(Continued)

FOREIGN PATENT DOCUMENTS

| | | |
|---|---|---|
| CN | 1675750 A | 9/2005 |
| CN | 1973358 A | 5/2007 |

(Continued)

OTHER PUBLICATIONS

Kok, K W "Investigation of in situ trench etchign process and Bosch process for fabricating high-aspect-ratio beams for microelectromechanical systems" Sep. 2002, J. Vac. Sci. Tech. B 20(5), p. 1878-1883.*

(Continued)

*Primary Examiner* — Allan Olsen
*Assistant Examiner* — Margaret D Klunk
(74) *Attorney, Agent, or Firm* — Patterson & Sheridan, LLP

(57) ABSTRACT

Embodiments of the invention relate to a substrate etching method and apparatus. In one embodiment, a method for etching a substrate in a plasma etch reactor is provided that include flowing a backside process gas between a substrate and a substrate support assembly, and cyclically etching a layer on the substrate.

9 Claims, 10 Drawing Sheets

(56) References Cited

U.S. PATENT DOCUMENTS

| | | | |
|---|---|---|---|
| 2002/0144974 A1* | 10/2002 | Laermer et al. | 216/37 |
| 2002/0179570 A1* | 12/2002 | Mathad et al. | 216/67 |
| 2003/0029834 A1 | 2/2003 | Lill et al. | |
| 2005/0037624 A1 | 2/2005 | Huang et al. | |
| 2005/0103749 A1* | 5/2005 | Puech et al. | 216/68 |
| 2006/0006136 A1* | 1/2006 | Mosden et al. | 216/37 |
| 2006/0223324 A1* | 10/2006 | Ikegami | 438/700 |
| 2007/0243693 A1* | 10/2007 | Nemani et al. | 438/424 |
| 2008/0023441 A1* | 1/2008 | Tsai | 216/58 |
| 2008/0061032 A1* | 3/2008 | Jennings et al. | 216/58 |
| 2008/0083610 A1* | 4/2008 | Tang et al. | 204/192.1 |
| 2010/0197138 A1 | 8/2010 | Cheshire et al. | |
| 2010/0308014 A1* | 12/2010 | Cheshire | 216/37 |
| 2012/0208300 A1 | 8/2012 | Cheshire et al. | |

FOREIGN PATENT DOCUMENTS

| | | |
|---|---|---|
| JP | 59-172237 A | 9/1984 |
| JP | 2008-172184 A | 7/2008 |
| TW | 502336 B | 9/2002 |

OTHER PUBLICATIONS

International Search Report and Written Opinion for PCT/US2010/022223 dated Aug. 9, 2010—provided as a concise statement of relevance for JP 59-172237 A.
USPTO Office Action for U.S. Appl. No. 13/455,379; 21 pages; Jul. 11, 2012.
USPTO Office Action for U.S. Appl. No. 13/455,379; 22 pages; Jan. 17, 2013.
Chinese Office Action (with attached English translation) for Aplication No. 201080006330.1; 13 total pages; Jun. 19, 2013.
USPTO Office Action for U.S. Appl. No. 13/455,379; 15 pages; Aug. 13, 2013.
Chinese Office Action (with attached English translation) for Application No. 201080006330.1; dated Feb. 24, 2014; 14 total pages.
Taiwan Office Action (with attached English translation) for Aplication No. 101118723; dated Sep. 15, 2014.
Office Action dated Jun. 19, 2013 for CN Application No. 201080006330.1, entitled Method and Apparatus for Etching.
Chinese Office Action dated Aug. 6, 2014 for Application No. 201080006330.1.

* cited by examiner

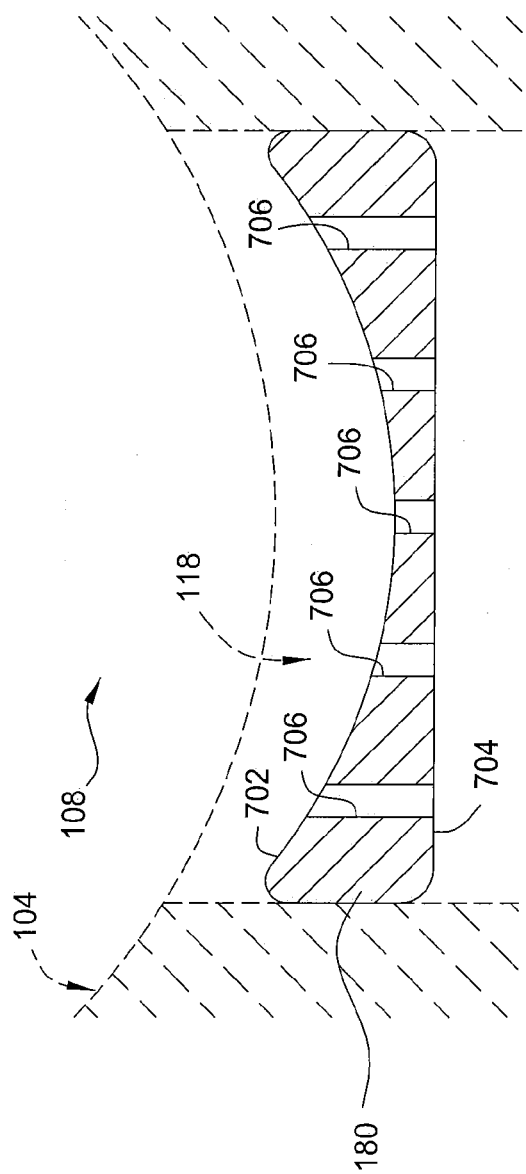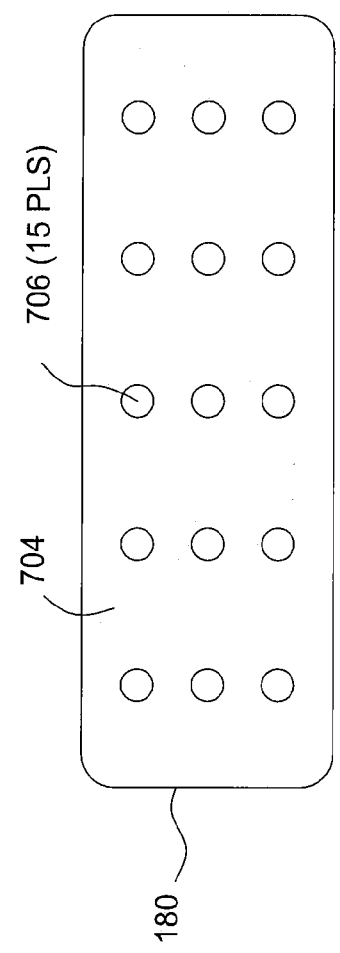

METHOD AND APPARATUS FOR ETCHING

CROSS-REFERENCE TO RELATED APPLICATION

This application claims benefit to U.S. Provisional Application Ser. No. 61/148,928, filed Jan. 31, 2009, which is incorporated by reference in its entirety.

BACKGROUND OF THE INVENTION

1. Field of the Invention

Embodiments of the invention generally relate a method and apparatus for etching, and more particularly, a method and apparatus suitable for etching Micro-Electro-Mechanical Systems (MEMS) devices and the like.

2. Description of the Related Art

The demand for Micro-Electro-Mechanical Systems (MEMS) devices has introduced new challenges for processing equipment companies. One challenge is providing equipment suitable for efficient plasma etching of materials utilized to fabricate MEMS structures. For example, processing equipment utilized for etching must be able to maintain good critical dimension control and mask selectivity in order to successfully manufacture MEMS structures on a commercially viable scale. Additionally for MEMS structures intended for optical devices, the processing equipment must produce sufficiently smooth sidewalls as not to inhibit obtaining performance goals.

Silicon is a material commonly used for MEMS structures. Silicon etching for MEMS fabrication is typically carried out in a reactive ion etch (RIE) reactor. Typical RIE reactors generally have limited small plasma generation areas and limited power capability. This makes it difficult to achieve good etching uniformity in larger substrate formats and also limits the etch rate. Moreover, RIE reactors generally etch faster in the center relative the edge of a substrate, which limits potential product yields and quality.

Some RIE etch reactors employ a cyclical etch process that includes several recipe steps, such as etch and deposition, or etch, flash, and deposition. The cyclical etch process may use a time multiplexed gas modulation ("TMGM") system or a Bosch system to sequentially provide etchants and deposition species. The deposition species provides a protective film upon the previously etched surface to protect the surface, typically the sidewalls of the trench, from further etching. These two steps are repeated as a deeper and deeper trench is formed. Poor control of the cyclical etch process disadvantageously increases the roughness of the sidewalls, which may render a microelectronic device defective.

Therefore, there is a need for an improved method and apparatus of for etching.

SUMMARY OF THE INVENTION

Embodiments of the invention relate to a substrate etching method and apparatus. In one embodiment, a method for etching a substrate in a plasma etch reactor is provided that include flowing a backside process gas between a substrate and a substrate support assembly, and cyclically etching a layer on the substrate.

In another embodiment, a method for etching a substrate in a plasma etch reactor is provided that includes cyclically etching a target layer on the substrate, adjusting a recipe variable during the cyclical etch in response to the current aspect ratio of the feature being etch.

In another embodiment, a plasma etch reactor is provided that includes a chamber body, a substrate support assembly, a ceiling and an interchangeable spacer. The substrate support assembly is in a process volume of the chamber body. The ceiling is disposed on the chamber body and covers the process volume. The interchangeable spacer is disposed the ceiling and chamber body. The interchangeable spacer is chosen from a plurality of interchangeable spacers which set at least one of the inclination and height of the ceiling relative to the substrate support assembly.

In another embodiment, a plasma etch reactor is provided that includes a chamber body, a substrate support assembly, a ceiling and a baffle plate. The chamber body has a pumping conduit. The substrate support assembly is disposed in a process volume of the chamber body. The ceiling is disposed on the chamber body and covers the process volume. The baffle plate is disposed in the pumping conduit and has a plurality of holes to allow gases to pass through the baffle plate and down the pumping conduit.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 6 is a sectional view of one embodiment of a baffle plate.

FIG. 7 is a back elevation of the baffle plate of FIG. 6.

Figure 1:
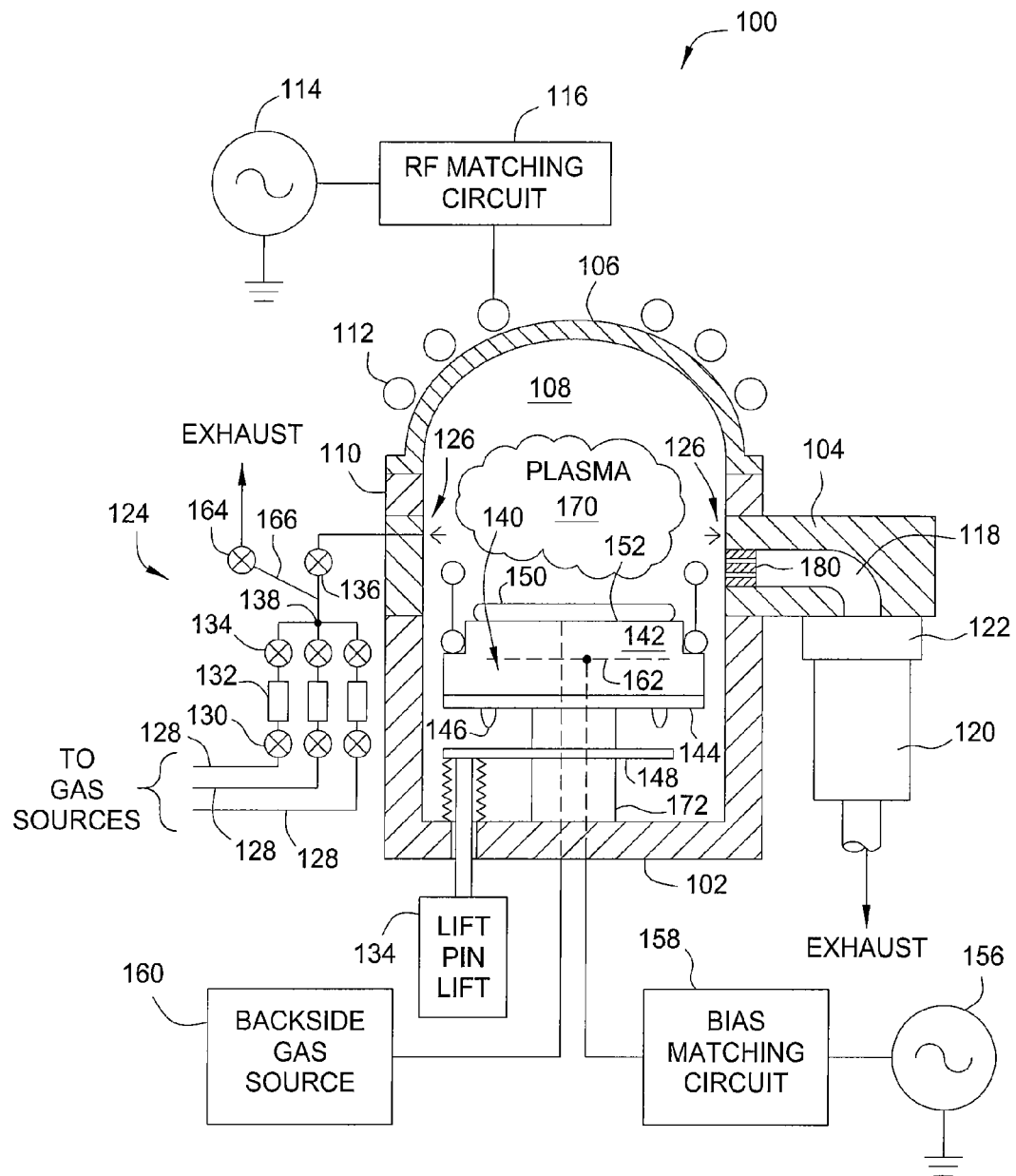
FIG. 1 is a sectional schematic of one embodiment of a substrate etching reactor.

To facilitate understanding, identical reference numerals have been used, where possible, to designate identical elements that are common to the figures. It is to be noted, however, that the appended drawings illustrate only typical embodiments of this invention and are therefore not to be considered limiting of its scope, for the invention may admit to other equally effective embodiments.

DETAILED DESCRIPTION

The invention generally relates to an apparatus and method for etching. Although the apparatus and methods described herein are particularly advantageous for etching silicon for MEMS applications, it is contemplated that the embodiments of the invention are not limited to use with silicon etching, but may be beneficially utilized to etch other types of materials and/or be utilized in other etch reactors. To better understand the novelty of the apparatus of the invention and the methods of use thereof, reference is hereafter made to the accompanying drawings.

FIG. 1 is a sectional view of one embodiment of an etch reactor 100. The etch reactor 100 includes a lower chamber body 102, an upper chamber body 104, and a ceiling 106 which enclose a process volume 108. The ceiling 106 may be flat or have other geometry. In one embodiment, the ceiling 106 is a dome. An interchangeable spacer 110 is provided between the ceiling 106 and the upper chamber body 104 so that the inclination and/or height of the ceiling relative to the upper chamber body 104 may be selectively changed, as further described below.

An RF coil 112 is disposed above the ceiling 106 and coupled to an RF source 114 through a matching circuit 116. The ceiling 106 is transmissive to the RF power such that power applied to the coil 112 may be inductively coupled to and energize gases disposed in the process volume 108 of the reactor 100 to maintain a plasma 170. Conventionally, the power applied to the coil 112 is known as source power.

The source power may be provided at a radio frequency within a range from about 12 Mhz to about 13.5 MHz at a power within a range from about 10 watts to about 5000 watts. The source power may be pulsed.

The upper chamber body 104 includes a pumping channel 118 that connects the process volume 108 of the reactor 100 to a pump 120 through a throttle valve 122. The pump 120 and throttle valve 122 may be operated to control the pressure within the process volume 108 of the reactor 100. The pump 120 also removes etch by-products. A baffle plate 180 is disposed in the pumping channel 118 to minimize contamination of the pump 120.

The reactor 100 has a fast gas exchange system 124 coupled thereto that provides process and/or other gases to the process volume 108 through nozzles 126 positioned around the interior of the upper chamber body 104 or other suitable location. The fast gas exchange system 124 selectively allows any singular gas or combination of gases to be provided to the process volume 108. In one embodiment, the fast gas exchange system 124 has three delivery lines 128, each coupled to a different gas source. The delivery lines 128 may be coupled to the same or different nozzles 126.

In the embodiment depicted in FIG. 1, each delivery line 128 includes a first valve 130, a mass flow meter 132, and a second valve 134. The second valves 134 are coupled to a common tee 138, which is coupled to the nozzles 126. The conduits through which gases flow from mass flow meters 132 to the interior volume is less than about 2.5 m in length, there by allowing faster switching times between gases. The fast gas exchange system 124 may be isolated from the process volume 108 of the reactor 100 by an isolation valve 136 disposed between the tee 138 and nozzles 126.

An exhaust conduit 166 is coupled between the isolation valve 136 and the tee 138 to allow residual gases to be purged from the fast gas exchange system 124 without entering the reactor 100. A shut off valve 164 is provided to close the exhaust conduit 166 when gases are delivered to the process volume 108 of the reactor 100.

Figure 2A:
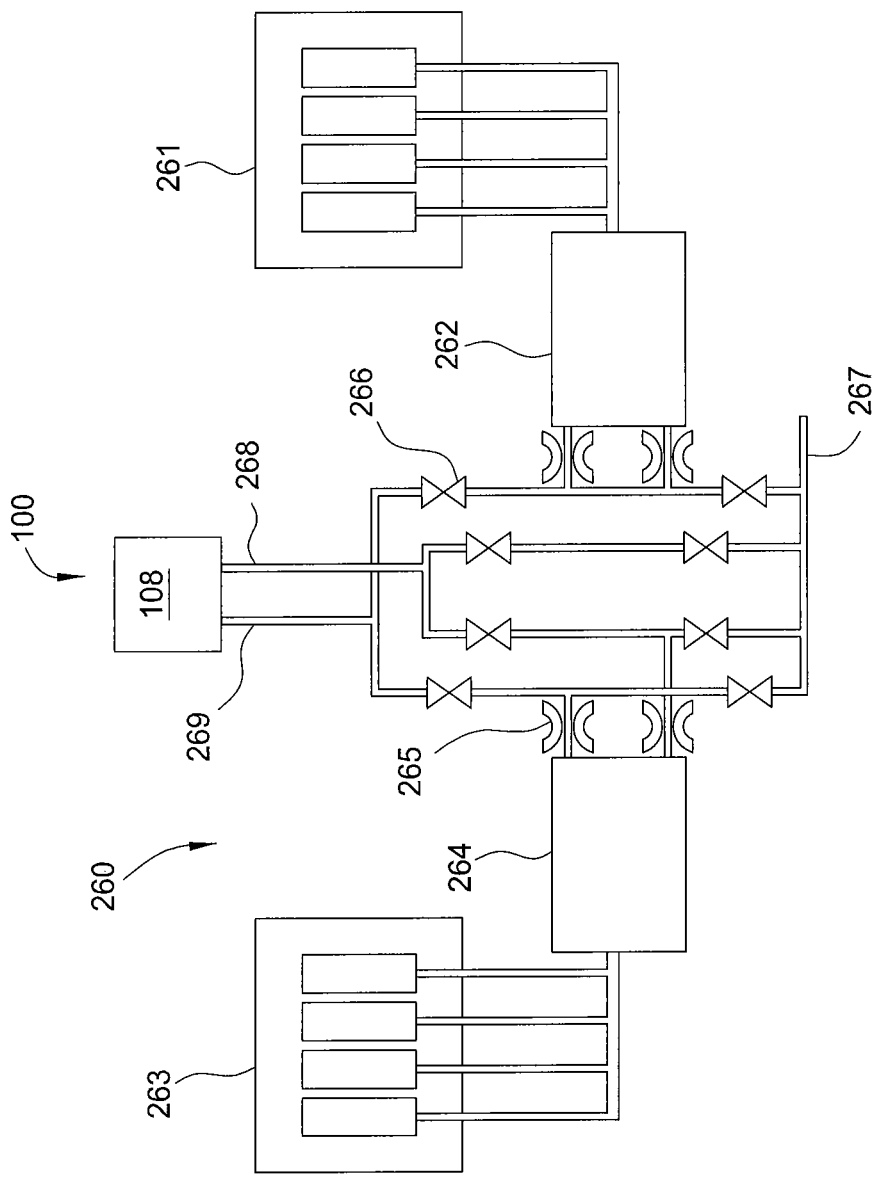
FIG. 2A shows a fast gas exchange system according to one embodiment of the invention.
Figure 2B:
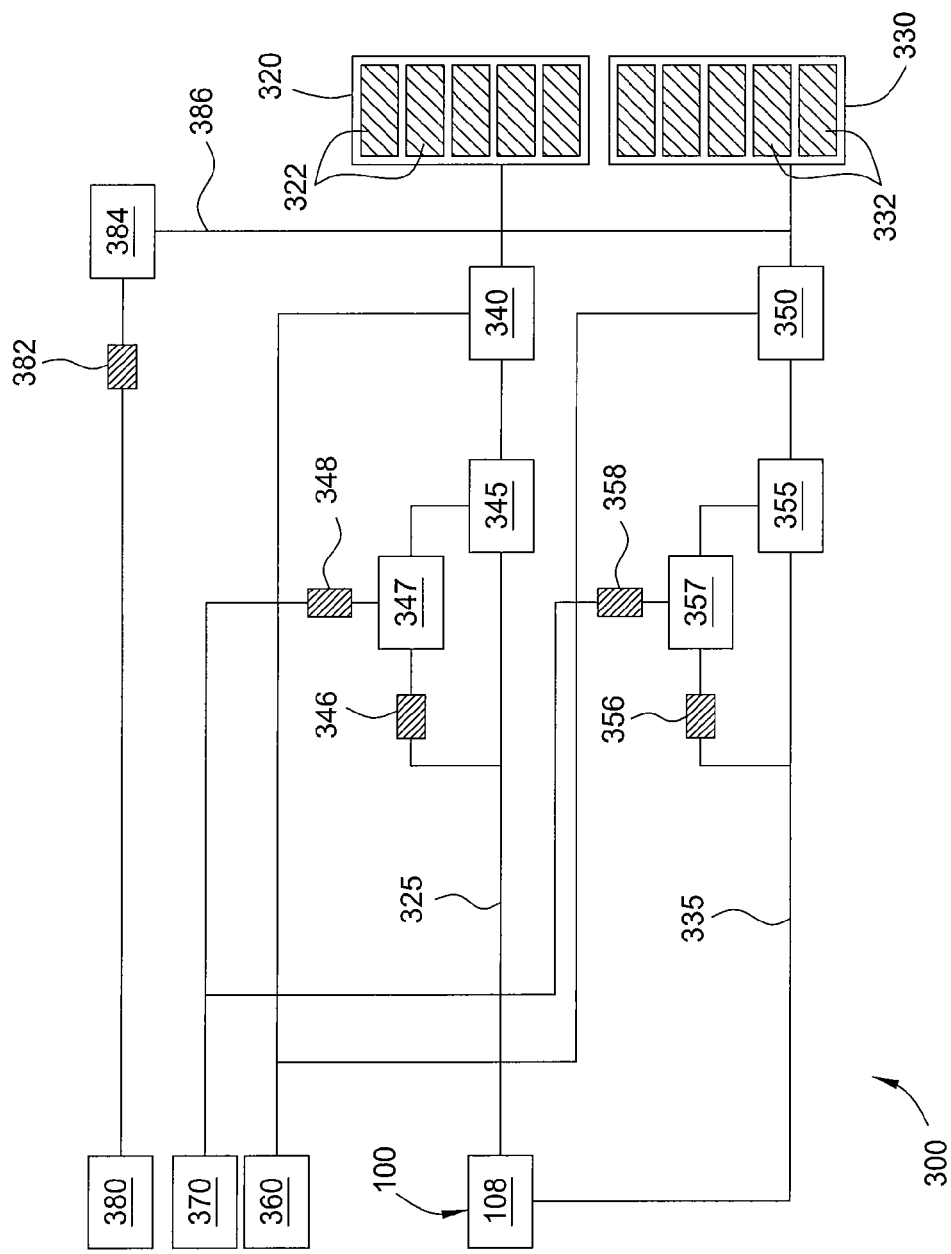
FIG. 2B shows another fast gas exchange system according to one embodiment of the invention.

FIGS. 2A and 2B depict alternative embodiments of a fast gas exchange system. In the embodiment of FIG. 2A, a fast gas exchange 260 includes a first gas panel 261 with a first flow controller 262 and a second gas panel 263 with a second flow controller 264, numerous flow restrictors 265 and valves 266 to direct gases into a first delivery conduit 268 and a second delivery conduit 269, and an exit 267 for dumping the gas. The first delivery conduit 268 and the second delivery conduit 269 are coupled to the same and/or different nozzles 126 of the reactor 100. Specifically, four flow restrictors 265 and eight valves 266 are shown in FIG. 2A, but the number of flow restrictors 265 and valves 266 may vary. The fast gas exchange 260 supplies a first gas, such as sulfur hexafluoride ($SF_6$), to the reactor 100 during the first etch step and the second etch step from the first gas panel 261, and also supplies a second gas, such as perfluorocyclobutane ($C_4F_8$), to the reactor 100 during the deposition step from the second gas panel 263. In one example, the first gas panel 261 and the second gas panel 263 are operable to deliver $SF_6$ and $C_4F_8$ at about 1000 sccm, helium at about 500 sccm, and oxygen ($O_2$) and argon at about 200 sccm. In an alternative embodiment, the fast gas exchange 260 may further include a third gas panel comprising of a plasma sustaining gas, such as argon, and operable to continuously deliver the gas to the reactor 100.

In operation, as the gas from the first gas panel 261 is supplied to the process volume 108, the first flow controller 262 may direct the gas to the first delivery conduit 268, the second delivery conduit 269, or both. The flow restrictors 265 may prevent the gas from re-entering into the first gas panel 261. As the gas is being supplied to the reactor 100, the valves 266 are operable to open the flow paths to the reactor 100 and close the flow paths to the exit 267. When the etching cycles switch steps, the gas from the second gas panel 263 may be supplied to the reactor 100 in a similar manner as the first gas panel 261. When the gas from the second gas panel 263 is being supplied to the reactor 100, the valves 266 may be operable to close the flow paths from the first gas panel to the reactor 100 and open the flow paths to the exit 267 to dump the gas in the flow lines. In one example, gas may be supplied from the first gas panel 261 to the reactor 100 during the deposition steps, and gas may be supplied from the second gas panel 263 to the reactor 100 during the etching steps. Both gas panels 261 and 263 may be used for both deposition and etching steps. In an alternative embodiment, a third gas panel may be used to continuously supply a plasma maintaining gas, such as argon, to the reactor 100 during both the deposition and etching steps.

In the embodiment of FIG. 2B, a fast gas exchange 300 includes a first gas panel 320 with a first flow controller 340, a second flow controller 345, and a third flow controller 347 to direct gases into the process volume 108 of the reactor 100, a first exhaust 360, and/or a second exhaust 370. The first gas panel 320 may include a plurality of gases 322, including but not limited to, sulfur hexafluoride, oxygen, argon, trifluoromethane ($CHF_3$), and/or helium. Each of the flow controllers 340, 345, and 347 may include flow control valves to direct the gases to the exhausts 360 and 370 and/or the process volume 108 of the reactor 100. The flow control valves may include pneumatic operation to allow rapid response and provide numerous flow configurations. In addition, the flow controllers 340, 345, and 347 may be in communication with an operating system to control and monitor the operation of the valves. Flow restrictors 346 and 348 may be coupled to the third flow controller 347 to restrict the flow to the first exhaust 360 and/or the process volume 108 of the reactor 100.

In one embodiment, the first flow controller 340 may be configured to direct gas to the first exhaust 360 and/or the second flow controller 345. The second flow controller 345 may be configured to direct gas to the process volume 108 of the reactor 100 and/or the third flow controller 347. The third flow controller 347 may be configured to direct gas to the second exhaust 370 through the flow restrictor 348 and/or the chamber 200 through the flow restrictor 346.

The fast gas exchange 300 may also include a second gas panel 330 with a first flow controller 350, a second flow controller 355, and a third flow controller 357 to direct gases into the process volume 108 of the reactor 100, the first exhaust 360, and/or the second exhaust 370. The second gas panel 330 may include a plurality of gases 332, including but not limited to perfluorocyclobutane, oxygen, argon, trifluoromethane, and/or helium. Each of the flow controllers 350, 355, and 357 may include flow control valves to direct the gases to the exhausts 360 and 370 and/or the process volume 108 of the reactor 100. The flow control valves may include pneumatic operation to allow rapid response and provide numerous flow configurations. In addition, the flow controllers 350, 355, and 357 may be in communication with an operating system to control and monitor the operation of the valves. Flow restrictors 356 and 358 may be coupled to the third flow controller 347 to restrict the flow to the second exhaust 370 and/or the process volume 108 of the reactor 100.

In one embodiment, the first flow controller 350 may be configured to direct gas to the first exhaust 360 and/or the second flow controller 355. The second flow controller 355 may be configured to direct gas to the process volume 108 of the reactor 100 and/or the third flow controller 357. The third flow controller 357 may be configured to direct gas to the second exhaust 370 through the flow restrictor 358 and/or the process volume 108 of the reactor 100 through the flow restrictor 356.

In operation, parallel gas lines 325 and 335 are configured to deliver gases independently to the process volume 108 of the reactor 100 through a series of flow controllers and restrictions, such as flow controllers 345, 347 and 355, 357, and in particular flow restrictors 346 and 356 to allow rapid gas switching. The gas lines 325 and 335 are also operable to rapidly deliver gases independent and/or directly into the process volume 108 of the reactor 100 to eliminate any gas delay observed through the flow restrictors 346 and 356. In an optional embodiment, the gas lines 325 and 335 may tie-in to each other prior to entering the reactor 100. A multitude of gas deliveries and configurations may be provided with the fast gas exchange 300. In one embodiment, a first gas (or combination of gases) may be delivered straight into the process volume 108 of the reactor 100, such as through gas line 325, and a second gas (or combination of gases) may be pulsed through the flow restrictor 356 of gas line 335 to allow controlled delivery options. Each of the valves in the fast gas exchange 300 may include check valves to prevent back diffusion of the gases delivered through the gas lines 325 and 335. The flow controllers 340 and 350 are operable to direct gases through dump forelines in communication with the exhaust 360. The flow controllers 347 and 357 are operable to direct gases through dump lines above TGV in communication with the exhaust 370.

In one embodiment, the fast gas exchange 300 may include an optional gas line 386 that is in communication with either or both of gas lines 325 and 335. The gas line 386 may include an optional flow controller 384 and/or an optional flow restrictor 382. The gas line 386 may be operable to direct gases to an exhaust 380 to dump the gases from the gas lines.

Returning to FIG. 1, a substrate support assembly 140 is disposed in the process volume 108 of the reactor 100. The substrate support assembly 140 includes an electrostatic chuck 142 mounted on a thermal isolator 144. The thermal isolator 144 insulates the electrostatic chuck 142 from a stem 172 that supports the electrostatic chuck 142 above the bottom of the lower chamber body 102.

Lift pins 146 are disposed through the substrate support assembly 140. A lift plate 148 is disposed below the substrate support assembly 140 and may be actuated by a lift 155 to selectively displace the lift pins 146 to lift and/or place a substrate 150 on an upper surface 152 of the electrostatic chuck 142.

The electrostatic chuck 142 includes at least one electrode (not shown) which may be energized to electrostatically retain the substrate 150 to the upper surface 152 of the electrostatic chuck 142. An electrode of the electrostatic chuck 142 is coupled to a bias power source 156 through a matching circuit 158. The bias power source 156 may selectively energize the electrode of the electrostatic chuck 142 to control the directionality of the ions during etching.

The bias power may be pulsed, e.g. repeatedly storing or collecting the energy over a time period and then rapidly releasing the energy over another time period to deliver an increased instantaneous amount of power, while the source power may be continuously applied. In particular, the bias power may be pulsed using generator pulsing capability set by a control system to provide a percentage of time that the power is on, which is referred to as the "duty cycle." In one embodiment, the time on and the time off of a pulsed bias power may be uniform throughout the etching cycles. For example, if the power is on for about 3 msec and off for about 15 msec, then the duty cycle would be about 16.67%. The pulsing frequency in cycles per second or hertz (Hz) is equal to 1.0 divided by the sum of the on and off time periods in seconds. For example, when the bias power is on for about 3 msec and off for about 15 msec, for a total of about 18 msec, then the pulsing frequency in cycles per second is about 55.55 Hz. In one embodiment, a specialized pulsing profile where the on/off timing changes during the etching cycles may be used. In one embodiment, by changing the bias power applied to the substrate, the etching cycle may switch between the deposition and/or etching steps. The bias power is pulsed to help reduce scalloping of the trench sidewalls, improve resist selectivity, improve the etch rate, and prevent material interface undercut.

Figure 3:
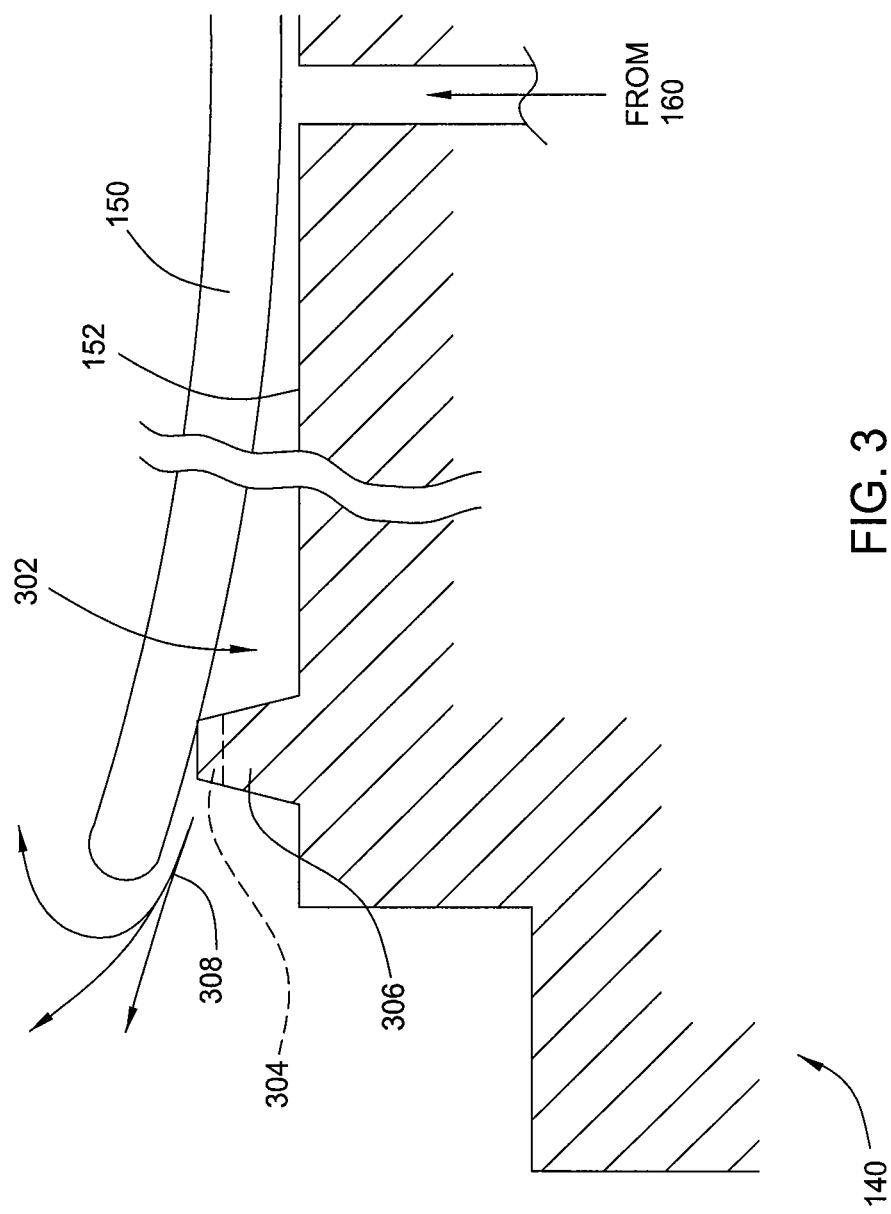
FIG. 3 is a partial sectional schematic of one embodiment of a substrate support assembly.

Referring additionally to FIG. 3, a backside gas source 160 is coupled through the substrate support assembly 140 to provide one or more gases to a space 302 defined between the substrate 150 and the upper surface 152 of the electrostatic chuck 142. Gases provided by the backside gas source 160 may include He and/or a backside process gas. The backside process gas is a gas delivered from between the substrate and the substrate support which affects the rate of etch or polymerization during the etch cycle by reacting with the materials in the chamber, such as process gases, etch by-products, mask or other layers disposed on the substrate or the material targeted for etching. In one embodiment, the backside process gas is an oxygen containing gas, such as $O_2$. In one embodiment, a ratio of He to $O_2$ in the backside gas is about 50:50 to about 70:30 by volume or by mass for silicon etch applications. It is contemplated that other backside process gases may be utilized to control the processes near the edge of the substrate. It is contemplated that the use of backside process gases may be used beneficially for single step etch processes as well as cyclical etch processes as described below. Moreover, providing the backside process gases from under the edge of the substrate provides a more targeted control of the etch process as opposed to providing the backside process gases with gases delivered through the nozzles 126.

To enable the process gas provided by the backside gas source 160 to reach the edge of the substrate 150, the rate of backside gas leakage from under the edge of the substrate 150 is higher than that of conventional backside gas systems. In one embodiment, the leak rate is elevated by maintaining the pressure of the gases in the space 302 between the substrate 150 and the upper surface 152 of the electrostatic chuck 142 between about 4 and 26 Torr. In another embodiment, the pressure is maintained between about 10 and 22 Torr. In still another embodiment, the pressure is maintained between about 14 and 20 Torr. It is contemplated that the leak rate may also be achieved by providing notches (304 shown in phantom) or other features in a lip 306 supporting the substrate 150 and the upper surface 152 of the electrostatic chuck 142.

Figure 4A:
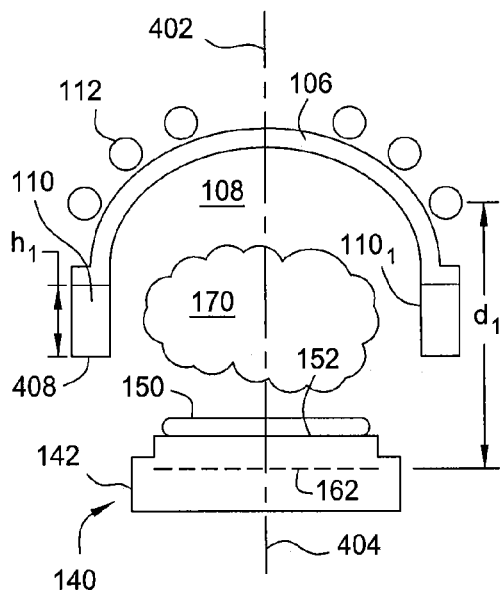
FIGS. 4A-C are various partial side views of a substrate etching reactor illustrating different spacers.
Figure 4B:
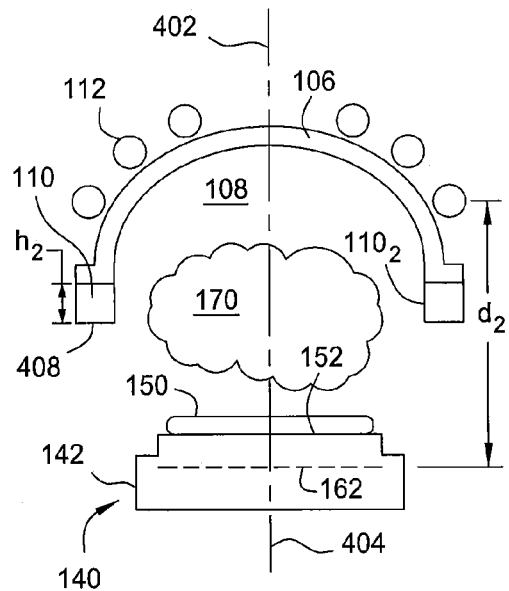
Figure 4C:
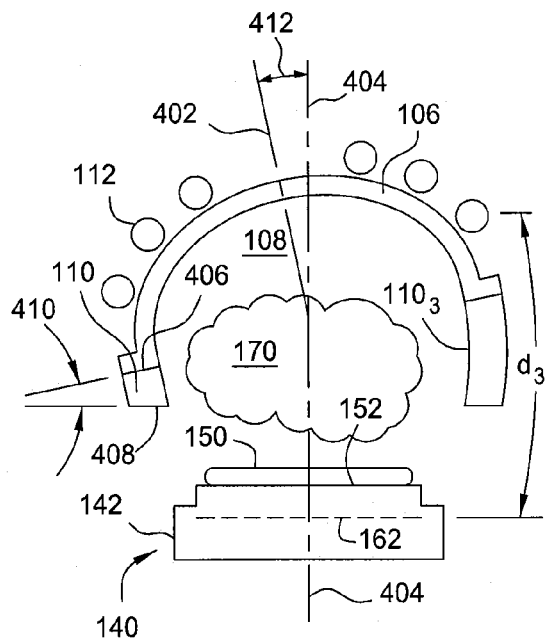

FIGS. 4A-C are various partial side views of the substrate etch reactor 100 illustrating different embodiments of spacers 110. As described above, the spacers 110 may be utilized to change the distance and inclination of the ceiling 106 and coils 112 disposed thereon relative to the electrode 162 disposed in the substrate support assembly 140. The spacer 110 may be fabricated from aluminum. The inside surface of the spacer 110 may be anodized for plasma resistance. The spacer 110 may be stackable (with other spacers) and be retrofit on existing reactors.

In the embodiment depicted in FIG. 4A, a spacer $110_1$ is utilized to set the coil 112 a distance $d_1$ from the electrode 162. The upper and lower surfaces of the spacer $110_1$ are parallel such that the center line of the coil 112 is concentric with the center line 404 of the substrate support.

In the embodiment depicted in FIG. 4B, the spacer $110_2$ is provided which has a height $H_2$ which is different than a height $H_1$ of the spacer $110_1$ of FIG. 4A. This causes the distance $d_2$ between the coil 112 and the electrode 162 of FIG. 4B to be different than the distance $d_1$ illustrated in FIG. 4A. In one embodiment, the difference between $d_1$ and $d_2$ is about 3 cm or multiples thereof.

It is believe that increased height (d) will increase ion bombardment by providing longer mean free paths, this in turn will allow more effective polymer removal during the etch cycle and increase etching speed. Another benefit is the source coils will be further away from the substrate which again, is believed in theory to provide better uniformity. The maximum height is determined by the clearance between the top of the reactor and the equipment above the reactor, which in one case was approximately 11 cm. Thus, the height (d) may selected to benefit different etch applications.

In the embodiment depicted in FIG. 4C, a spacer $110_3$ is utilized. The spacer $110_3$ has an upper surface 406 orientated at an angle 410 relative to a lower surface 408 of the spacer which rests upon the upper chamber body 104 (not shown). This results in a change of the inclination of the coil 112 relative to the electrode 162. This is illustrated by angle 412 defined between the center line 402 of the coil 112 and the center line 404 of the substrate support assembly 140.

By utilizing a spacer selected to place the coil 112 in a pre-defined orientation relative to the electrode 162, the characteristics, location and/or properties of the plasma 170 may be altered to tune the etch results. For example, the inclination may be selected at an angle 412 greater than zero to compensate for chamber asymmetries such as non-uniform electrical characteristics caused by the slit valve location or pumping asymmetries caused by the location of the pump 120.

The spacers may also be utilized to tune the plasma characteristics in other manners. For example, the material of the spacer may be selected to influence the processing results. Additionally, the inside diameter of the spacer may be selected to have certain geometries which influence the processing results.

FIGS. 5A-E depict alternative embodiments of a spacer having different inside diameter profiles. In the embodiment depicted in FIG. 5A, the spacer 110 is illustrated. The spacer 110 includes an outside diameter 502 and an inside diameter 504. The inside diameter 504 and the outside diameter 502 are concentric.

Figure 5A:
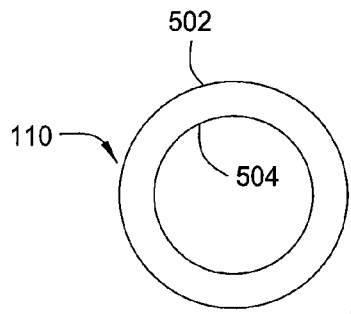
FIGS. 5A-E are bottom views of alternative embodiment of a spacers.
Figure 5B:
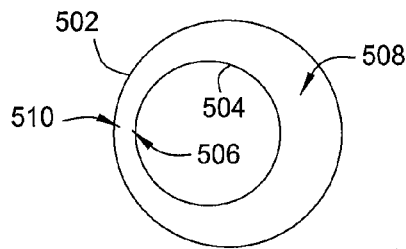

In the embodiment depicted in FIG. 5B, the spacer 510 is shown having an inside diameter 504 which is not concentric with the outside diameter 502. This results in the spacer 510 having greater mass in one region 508 relative to another region 506. The spacer 510 may be orientated such that the regions 506, 504 are positioned relative to the slit valve door and/or passages leading to the pump 120 to produce and/or compensate for asymmetries in the etch results.

Figure 5C:
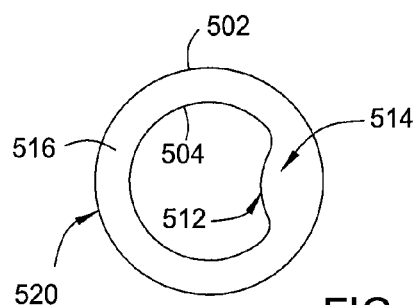

In the embodiment depicted in FIG. 5C, a spacer 520 is illustrated, having an inside diameter 504 and an outside diameter 502. The inside diameter 504 is substantially concentric with the outside diameter 502. It is also contemplated that the inside diameter 504 may be non-concentric to the outside diameter 502. The inside diameter 504 has one or more projections 512 extending therefrom toward the center of the spacer 520. The projection 512 creates a region 514 having greater mass than another region 516 of the spacer 520. As discussed above, the region 514 having greater mass may be orientated relative to the passages leading to the pump and/or slit valve to produce a desired etching effect. It is contemplated that the spacer 520 may include more than one projection 512 and the distribution of the projections 512 may be utilized to create the regions 514 and 516.

Figure 5E:
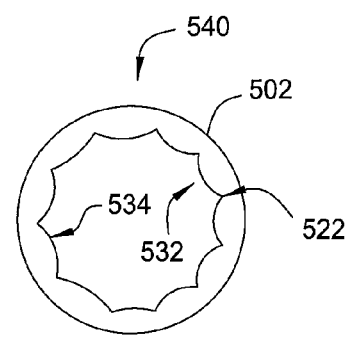
Figure 5D:
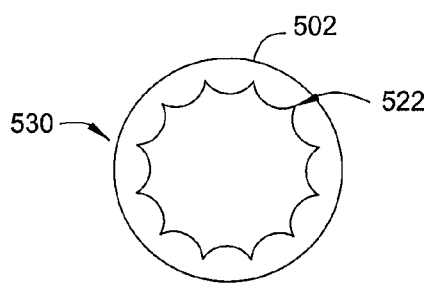

In the embodiment depicted in FIG. 5D, a spacer 530 is illustrated. The spacer 530 includes an inside diameter 504 which is concentric with the outside diameter 502. It is also contemplated that the inside diameter 504 may be non-concentric to the outside diameter 502. A plurality of cut-outs 522, such as notches, grooves or other geometry, are formed in the inside diameter 504 of the spacer 530. The number, distribution and density of the cut-outs 522 may be selected to produce a desired etching effect. For example, as depicted in FIG. 5E, a dense concentration of cut-outs 522 may be located on one side of the spacer 540 creating a region 534 having greater mass relative to a region 532 having less mass where the density of cut-outs 522 is greater. As discussed above, the orientation of the region having greater density may be selected in the chamber in order to produce a desired etching result.

FIGS. 6 and 7 are sectional and back elevation of one embodiment of the baffle plate 180. The baffle plate 180 is fabricated from a ceramic or other suitable material. In one embodiment, the baffle plate 180 is fabricated from $Al_2O_3$.

The baffle plate 180 is disposed in the pumping channel 118 (shown in phantom in FIG. 6). In one embodiment, the baffle plate 180 is elongated and spans the entire cross-section of the pumping channel 118. The baffle plate 180 includes a front side 702 facing the process volume 108 of the reactor 100 and a back side 704 facing towards the pump 120 (not shown in FIG. 6). The front side 702 may be flat or curved. In the embodiment depicted in FIG. 6, the front side 702 is curved on a radius having an origin at the center of the process volume 108 that is aligned with the centerline 404 of the substrate support (shown in FIGS. 4A-C) (i.e., the front side 702 is concave). The back side 704 of the baffle plate 180 is flat.

A plurality of holes 706 are formed through the baffle plate 180 to allow gases to pass from the process volume 108 to the pump 120. The holes 706 are configured to prevent plasma passing though the baffle plate 180 from entering the pumping channel 118, thereby minimizing deposition of material downstream of the baffle plate 180. The baffle plate 180 has demonstrated to be particularly effective in minimizing deposition of polymers on the pump 120. In one embodiment, 15 holes 706 are formed through the baffle plate 180. In one embodiment, holes 706 through the baffle plate 180 are arranged in three rows, for example, three rows of 5 holes.

Figure 8:
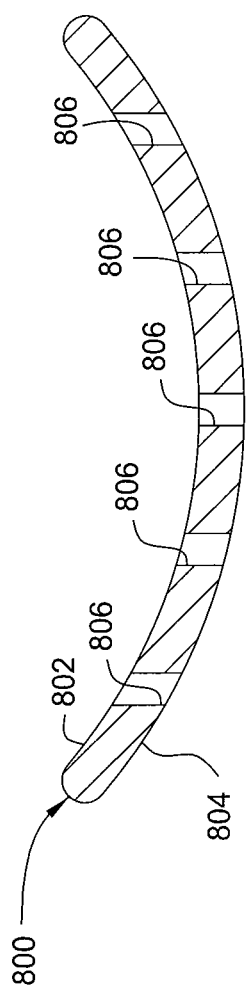
FIG. 8 is a sectional view of one embodiment of a baffle plate.
Figure 9:
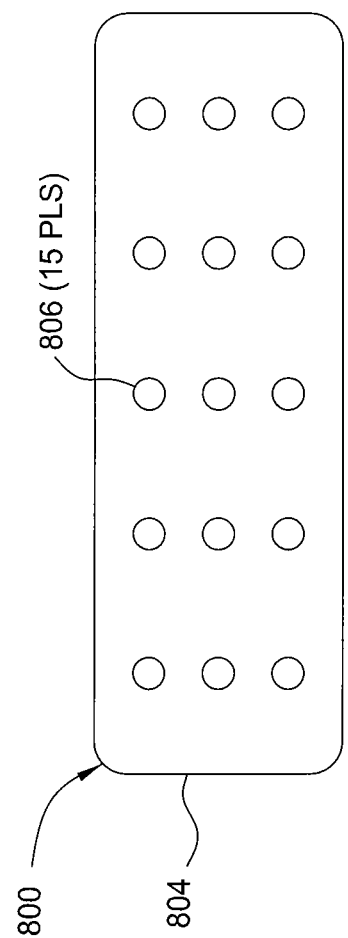
FIG. 9 is a back elevation of the baffle plate of FIG. 8.

FIGS. 8 and 9 are sectional and back elevation of another embodiment of a baffle plate 800. The baffle plate 800 may be fabricated from a ceramic or other suitable material. The baffle plate 800 may be disposed in the pumping channel 118 to prevent polymers from contaminating the pumping component.

The baffle plate 800 includes a front side 802 facing the process volume 108 of the reactor 100 and a back side 804 facing towards the pump 120 (not shown in FIG. 8). The front side 802 may be flat or curved. In the embodiment depicted in FIG. 8, the front side 802 is curved on a radius having an origin at the center of the process volume 108 that is aligned with the centerline 404 of the substrate support (shown in FIGS. 4A-C).

The back side 804 of the baffle plate 180 may also be flat or curved. In the embodiment depicted in FIG. 8, the back side 804 of the baffle plate 180 is curved and concentric with the front side 802.

A plurality of holes 806 are formed through the baffle plate 800 to allow gases to pass from the process volume 108 to the pump 120. The holes 806 are configured to prevent plasma from entering the pumping channel 118. In one embodiment, 15 holes 806 are formed through the baffle plate 800. In one embodiment, holes 806 through the baffle plate 800 are arranged in three rows, for example, three rows of 5 holes.

Figure 10:
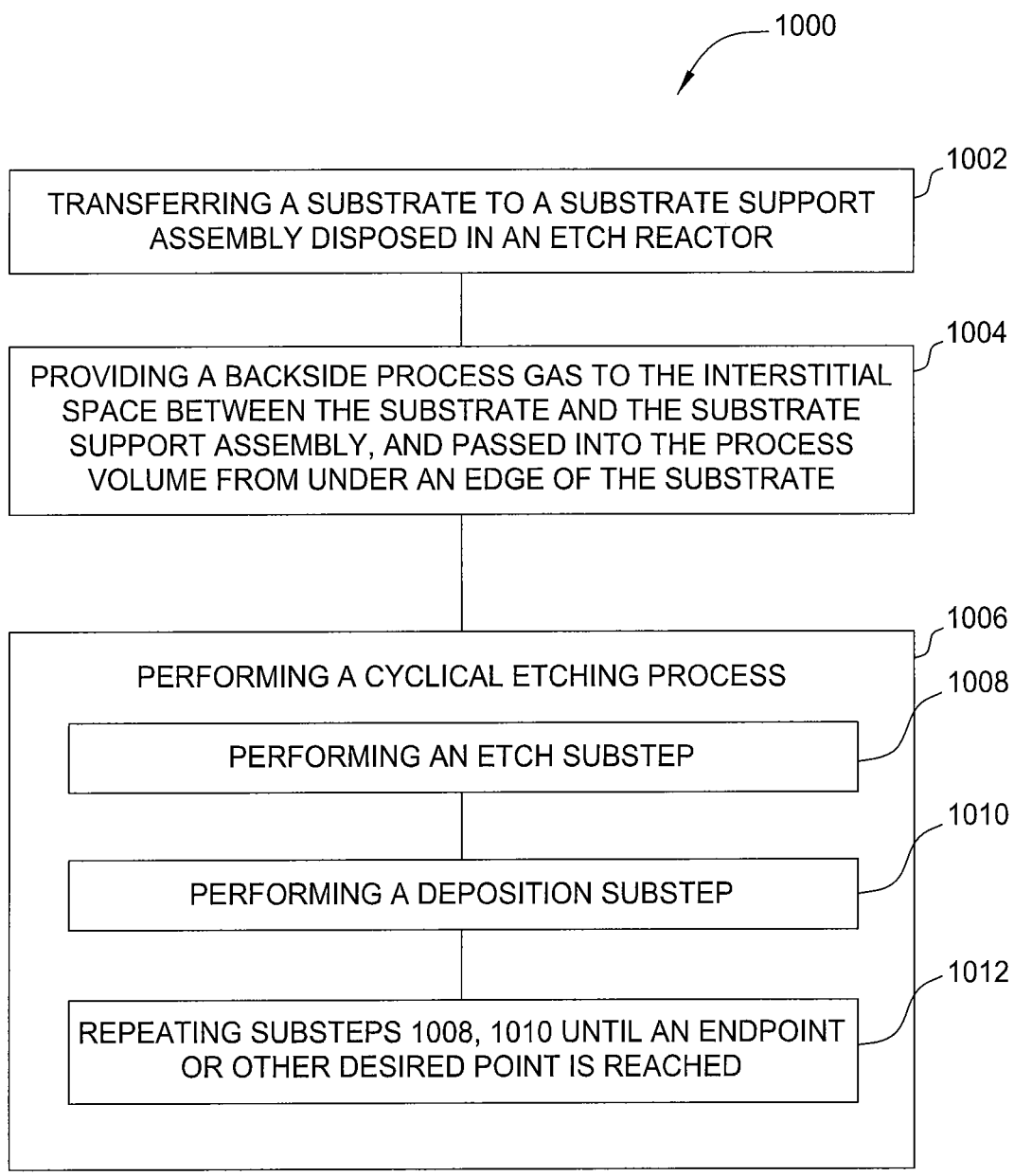
FIG. 10 is a flow diagram of one embodiment of an etching process.

FIG. 10 depicts a flow diagram of one embodiment of a method for etching a substrate. The method may be practiced in the etch reactor 100 or other suitable etch reactor. The method begins at step 1002 by transferring a substrate to a substrate support assembly 140 disposed in the reactor.

At step 1004, backside gas is provided to the interstitial space between the substrate and the substrate support assembly, and passed into the process volume 108 from under the edge of the substrate 150. In one embodiment, the backside gas contains a backside process gas. The backside gas contains may also contain He or other inert gas. The backside process gas affects at least one of the etching or deposition substep described further below.

In one embodiment, the backside process gas includes a polymer forming gas. In one embodiment, the polymer forming gas is an oxygen-containing gas, such as $O_2$. Helium or other inert gas may be present in the backside gas. In one embodiment, the ratio of helium to backside process gas in the backside gas is between about 50:50 and about 70:30 by weight or mass. The pressure of backside gas is provided in a range of about 4 and 26 Torr or other pressure suitable to ensure a sufficient leakage of backside gas from below the edge of the wafer such that the backside process gas affects processing on the substrate's surface.

At step 1006, a cyclical etching process is performed. The cyclical etching process includes at least one etch substep 1008 and at least one deposition substep 1010. The substeps are repeatedly performed until an endpoint is reached. The endpoint may be determined through time, effluent monitoring, plasma monitoring, thickness monitoring or other suitable endpoint detection method.

In one embodiment suitable for etching silicon, the etch substep 1008 includes providing a fluorine-containing gas. Suitable fluorine-containing gases include $SF_6$, $NF_3$, $CF_4$, $CHF_3$, $ClF_3$, $BrF_3$, $IF_3$, or derivatives thereof. The etch substep 1008 may have a duration of less than about seven seconds. In one embodiment, the etch substep 1008 is between one to three seconds. A first portion of the etch substep 1008 may include the introduction of an oxygen-containing gas through the fast gas exchange to preferentially etch polymer from the bottom, horizontal surfaces of the feature being etch to expose silicon material for subsequent etching during a second portion of the substep 1008.

The polymer deposition substep 1010 may include providing a polymer-forming gas through the fast gas manifold. The polymer-forming gas may include a carbon-containing gas such as $C_4F_8$. Other suitable polymer-forming gases may be utilized. The duration of the substep 1010 is similar to that of substep 1008.

Rapid switching between the substep 1008 to substep 1010 and back is augmented by the use of mass flow controller in the fast gas exchange system 124 having response times in the range of 300 ms. Faster switching between substeps 1008, 1010 results in faster etch rates and less scalloping of the feature sidewalls.

The substeps 1008, 1010 are repeated at substep 1012 until the endpoint or other desired point is reached. It is contemplated that the last substep 1010 in a series of repetition substeps 1012 may be omitted once the endpoint is reached.

Figure 11:
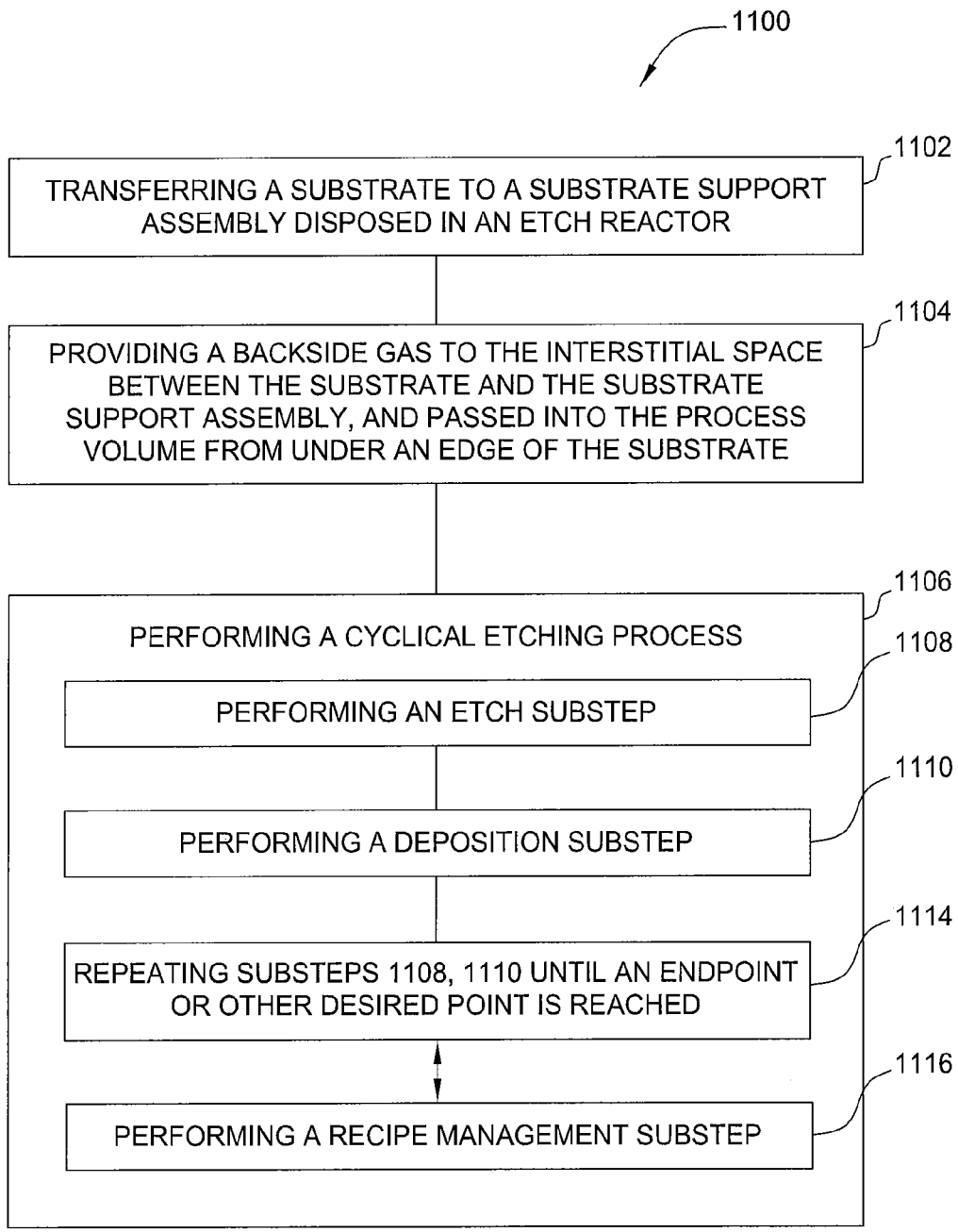
FIG. 11 is a flow diagram of another embodiment of an etching process.

FIG. 11 depicts a flow diagram of one embodiment of a method for etching a substrate. The method may be practiced in the etch reactor 100 or other suitable etch reactor.

The method begins at step 1102 by transferring a substrate to a substrate support assembly 140 disposed in the reactor. At step 1104, backside gas is provided to the interstitial space between the substrate and the substrate support assembly, and passed into the process volume 108 from under the edge of the substrate 150. In one embodiment, the backside gas contains a backside process gas as described above.

At step 1106, a cyclical etching process is performed. The cyclical etching process includes at least one etch substep 1108 and at least one deposition substep 1110. The substeps 1108, 1110 are repeated at substep 1112 until the endpoint or other desired point is reached. It is contemplated that the last substep 1110 in a series of repetition substeps 1112 may be omitted once the endpoint is reached.

During one or more of the repetition substeps 1112, a recipe management substep 1114 is performed. The recipe management substep 1114 adjusts certain recipe variable in response to the current aspect ratio of the feature being etched. For example, with each repetition substeps 1112, the depth of the etch feature increases, thereby increasing the aspect ratio of the feature being etched. As the aspect ratio increases, etch performance changes if the recipe remains static. The recipe management substep 1114 compensates for this by adjusting certain process recipe variables such that the etch performance is maintained and/or optimized for the current aspect ratio of the feature. For example, the thickness of the sidewall polymers must be managed in deeper trenches to avoid closing the trench and preventing subsequent etching. Therefore, as the aspect ratio continually increases over subsequent cycles, one or more of the variables process recipe is adjusted (e.g., ramped up or down) to maintain and/or optimize the etch performance. Some variables include bias power, bias duty cycle, bias power pulsing, substrate support assembly temperature, source power, chamber pressure, process gas flow rates and process gas composition, among others.

The forgoing process and equipment has demonstrated a significant improvement over conventions processes and conventions designs. CD bias proximate the edge of the substrate may be controlled using the backside process gas for more uniform etch results across the substrate.

While the foregoing is directed to embodiments of the invention, other and further embodiments of the invention may be devised without departing from the basic scope thereof, and the scope thereof is determined by the claims that follow.

What is claimed is:

1. A method for etching a substrate in a plasma etch reactor comprising:
   flowing $O_2$ gas out from between an edge of a substrate and a substrate support assembly and into a plasma processing chamber;
   cyclically etching a silicon layer on the substrate in the plasma processing chamber in the presence of the $O_2$ gas, wherein cyclically etching the silicon layer further comprises;
      at least one etch substep utilizing a plasma formed from a fluorine-containing gas further comprising at least one of $SF_6$, $NF_3$, $CF_4$, $CHF_3$, $ClF_3$, $BrF_3$, $IF_3$, or derivatives thereof; and
      at least one deposition substep utilizing a polymer-forming carbon-containing gas comprising fluorine.

2. The method of claim 1 further comprising flowing He with the $O_2$ gas out from between an edge of the substrate and the substrate support assembly.

3. The method of claim 2, wherein a ratio of He to $O_2$ gas flowing out from between an edge of the substrate and the substrate support assembly is about 50:50 to about 70:30 by volume or by mass.

4. The method of claim 1, wherein the polymer-forming carbon-containing gas is $C_4F_8$.

5. The method of claim 1, wherein the etch substep has a duration of less than about seven seconds.

6. The method of claim 1, wherein the etch substep further comprises:
   introducing an oxygen-containing gas with the fluorine-containing gas to preferentially etch polymer from a bottom, horizontal surfaces of a feature being etched to expose silicon material for subsequent etching during a second portion of the etch substep.

7. The method of claim 1 further comprising:
   adjusting a recipe variable during the cyclical etch in response to the current aspect ratio of the feature being etched.

8. A method for etching a substrate in a plasma etch reactor comprising:
   flowing an oxygen-containing gas out from between an edge of a substrate and a substrate support assembly and into a plasma processing chamber;
   cyclically etching a silicon layer on the substrate in the plasma processing chamber in the presence of the oxygen-containing gas, wherein cyclically etching the silicon layer further comprises;
      at least one etch substep utilizing a plasma formed from a fluorine-containing gas; and
      at least one deposition substep utilizing a polymer-forming carbon-containing gas comprising fluorine.

9. The method of claim 8, wherein the etch substep further comprises:
   introducing an oxygen-containing gas with the fluorine-containing gas to preferentially etch polymer from a bottom, horizontal surfaces of a feature being etched to expose silicon material for subsequent etching during a second portion of the etch substep.

* * * * *

UNITED STATES PATENT AND TRADEMARK OFFICE
CERTIFICATE OF CORRECTION

| | | |
|---|---|---|
| PATENT NO. | : 8,937,017 B2 | Page 1 of 1 |
| APPLICATION NO. | : 12/696773 | |
| DATED | : January 20, 2015 | |
| INVENTOR(S) | : Cheshire et al. | |

It is certified that error appears in the above-identified patent and that said Letters Patent is hereby corrected as shown below:

In the Specification

Column 6, Line 54, please delete "50:50to" and insert --50:50 to-- therefor.

Signed and Sealed this
Twenty-third Day of June, 2015

Michelle K. Lee
*Director of the United States Patent and Trademark Office*